US012599024B2

(12) United States Patent
Wei et al.

(10) Patent No.: US 12,599,024 B2
(45) Date of Patent: Apr. 7, 2026

(54) DISPLAY MODULE AND SUBSTRATE THEREOF HAVING IMPROVED BINDING RELIABILITY OF SUBSTRATE AND FLEXIBLE CIRCUIT BOARD

(71) Applicants: Wuhan Tianma Micro-Electronics Co., Ltd., Wuhan (CN); Wuhan Tianma MicroElectronics Co., Ltd. Shanghai Branch, Shanghai (CN)

(72) Inventors: Qibing Wei, Shanghai (CN); Peng Zhang, Shanghai (CN); Xingyao Zhou, Shanghai (CN); Wei Liu, Shanghai (CN)

(73) Assignees: Wuhan Tianma Micro-Electronics Co., Ltd., Wuhan (CN); Wuhan Tianma MicroElectronics Co., Ltd. Shanghai Branch, Shanghai (CN)

( * ) Notice: Subject to any disclaimer, the term of this patent is extended or adjusted under 35 U.S.C. 154(b) by 757 days.

(21) Appl. No.: 17/901,563

(22) Filed: Sep. 1, 2022

(65) Prior Publication Data

US 2023/0361065 A1     Nov. 9, 2023

(30) Foreign Application Priority Data

May 6, 2022    (CN) .......................... 202210488783.7

(51) Int. Cl.
*H01L 23/00* (2006.01)
*H10D 86/40* (2025.01)
*H10D 86/60* (2025.01)

(52) U.S. Cl.
CPC .............. *H01L 24/06* (2013.01); *H01L 24/05* (2013.01); *H01L 24/32* (2013.01);
(Continued)

(58) Field of Classification Search
CPC ......... H01L 24/06; H01L 24/05; H01L 24/32; H01L 2224/05567; H01L 2224/06155;
(Continued)

(56) References Cited

U.S. PATENT DOCUMENTS

2012/0299888 A1* 11/2012 Kim .................... G02F 1/13458
345/55
2015/0170982 A1* 6/2015 Jeong ..................... G09G 3/006
257/48
(Continued)

FOREIGN PATENT DOCUMENTS

CN         103399670 A     11/2013
CN         109459895 A     3/2019
(Continued)

*Primary Examiner* — Norman D Richards
*Assistant Examiner* — Laura M Dykes
(74) *Attorney, Agent, or Firm* — Anova Law Group, PLLC

(57) ABSTRACT

A module and a substrate are provided in the present disclosure. The module includes an array substrate and a flexible circuit board. The array substrate includes a binding region including a first binding region and a second binding region; and in the binding region, the flexible circuit board is bound with the array substrate. In the first binding region, the array substrate includes a first conductive soldering pad; the flexible circuit board includes a second conductive soldering pad; and the first conductive soldering pad is electrically connected to the second conductive soldering pad. In the second binding region, the array substrate includes one or more of first soldering elements; the flexible circuit board includes one or more of second soldering elements; a first soldering element of the one or more of first soldering elements is fixed with a second soldering element of the one or more of second soldering elements.

15 Claims, 13 Drawing Sheets

(52) U.S. Cl.
CPC .............. *H01L 2224/05567* (2013.01); *H01L 2224/06155* (2013.01); *H01L 2224/32104* (2013.01); *H01L 2224/32111* (2013.01); *H01L 2224/32227* (2013.01); *H01L 2924/30205* (2013.01); *H10D 86/443* (2025.01); *H10D 86/60* (2025.01)

(58) Field of Classification Search
CPC . H01L 2224/32104; H01L 2224/32111; H01L 2224/32227; H01L 2924/30205; H10D 86/443; H05K 3/323; H05K 2201/10128; H05K 1/189; H05K 9/0064
USPC ......................................................... 257/773
See application file for complete search history.

(56) References Cited

U.S. PATENT DOCUMENTS

| | | | | |
|---|---|---|---|---|
| 2019/0067406 | A1* | 2/2019 | Lee ...................... | H10K 59/123 |
| 2019/0385497 | A1* | 12/2019 | Huang ................... | G09G 3/006 |
| 2020/0210041 | A1* | 7/2020 | Liu ..................... | G06F 3/04164 |
| 2021/0249500 | A1* | 8/2021 | Lee ........................ | G09G 3/006 |
| 2023/0034834 | A1* | 2/2023 | Moon ................. | H01L 25/0753 |

FOREIGN PATENT DOCUMENTS

| | | | | |
|---|---|---|---|---|
| CN | 111951669 | A | | 11/2020 |
| CN | 112037649 | A | | 12/2020 |
| JP | H01237523 | A | * | 9/1989 |
| KR | 20080067535 | A | * | 7/2008 |

* cited by examiner

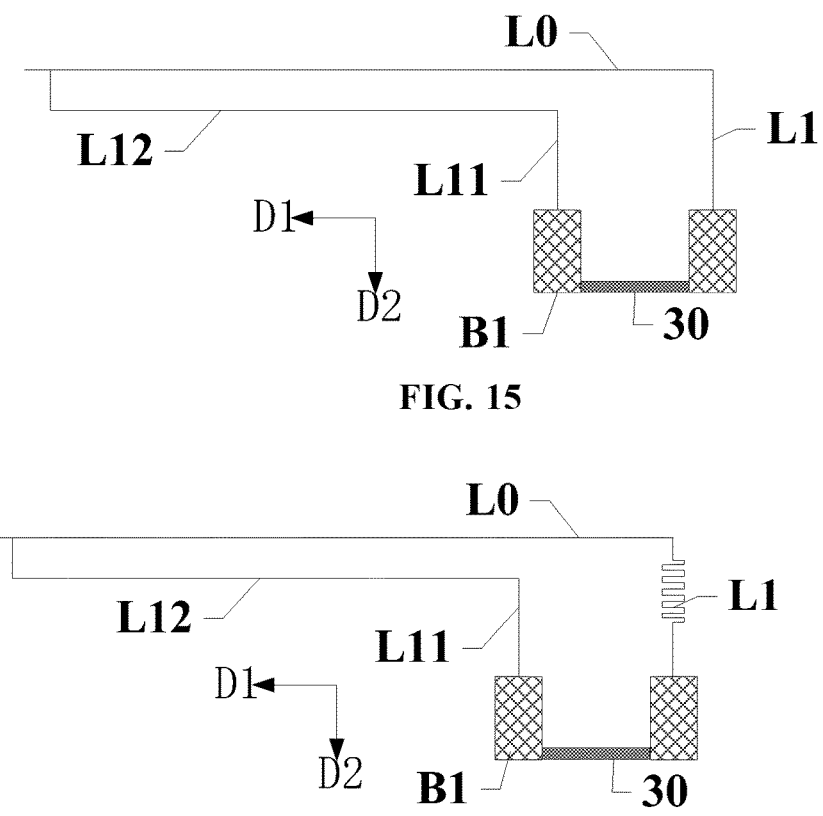
FIG. 15
FIG. 16
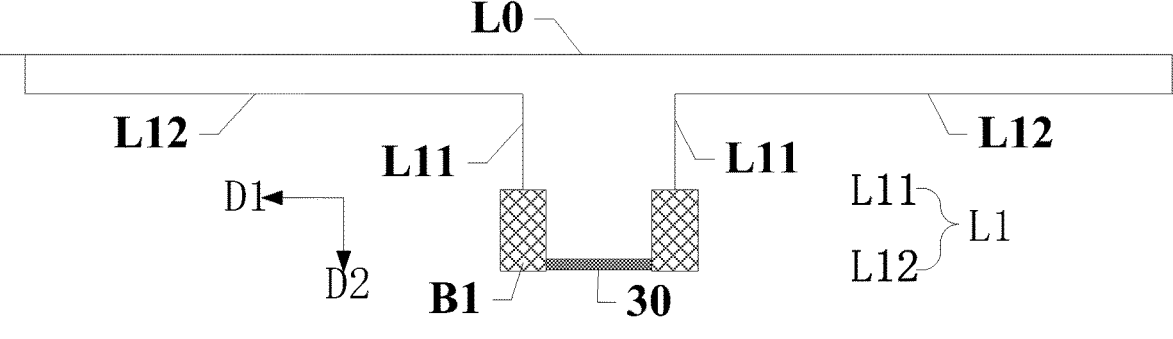
FIG. 17

DISPLAY MODULE AND SUBSTRATE THEREOF HAVING IMPROVED BINDING RELIABILITY OF SUBSTRATE AND FLEXIBLE CIRCUIT BOARD

CROSS-REFERENCE TO RELATED APPLICATION

This application claims the priority of Chinese Patent Application No. 202210488783.7, filed on May 6, 2022, the content of which is incorporated herein by reference in its entirety.

TECHNICAL FIELD

The present disclosure generally relates to the field of display technology and, more particularly, relates to a module and a substrate.

BACKGROUND

Electronic products, especially portable products, are designed to be lighter, thinner and smaller. Therefore, new materials and assembly technologies, for example, COF (chip on flex or chip on film), are constantly being developed. COF is a die soft film packaging technology that fixes an integrated circuit (IC) on a flexible circuit board. Both the panel and the flexible circuit board of the electronic product are provided with binding soldering pads, and the binding soldering pads on the panel can be electrically connected to the binding soldering pads on the flexible circuit board through an anisotropic conductive adhesive film. In order to improve the binding reliability, dummy soldering pads may be configured on both the panel and the flexible circuit board. The dummy soldering pads of the panel may be bound with the dummy soldering pads of the flexible circuit board, and the binding reliability may be improved by increasing the binding region.

However, in the formation process of electronic products, static electricity generation cannot be effectively avoided. At the positions of the dummy soldering pads, when static electricity invades, the tip discharge phenomenon may occur, resulting in tearing at the positions of the dummy soldering pads on the panel and the flexible circuit board. In subsequent reliability test, such as salt spray test, the dummy soldering pads may be likely to be corroded which may affect overall binding reliability.

SUMMARY

One aspect of the present disclosure provides a module. The module includes an array substrate and a flexible circuit board. The array substrate includes a binding region; and the binding region includes a first binding region and a second binding region; and in the binding region, the flexible circuit board is bound with the array substrate through a conductive adhesive. In the first binding region, the array substrate includes a first conductive soldering pad; the flexible circuit board includes a second conductive soldering pad; and the first conductive soldering pad is electrically connected to the second conductive soldering pad. In the second binding region, the array substrate includes one or more of first soldering elements; the flexible circuit board includes one or more of second soldering elements; a first soldering element of the one or more of first soldering elements is fixed with a second soldering element of the one or more of second soldering elements; and at least one first soldering element of the one or more of first soldering elements is insulated from the one or more of second soldering elements.

Another aspect of the present disclosure provides a substrate. The substrate includes a first region and a second region surrounding the first region, where the second region includes a binding region; the binding region includes a first binding region and a second binding region; along a first direction, the second binding region is on at least one side of the first binding region; a plurality of first conductive soldering pads is disposed in the first binding region; one or more of first soldering elements is disposed in the second binding region; and the first direction is an arrangement direction of the plurality of first conductive soldering pads. The substrate further includes a disposed first wiring, where the first wiring is on a side of the binding region away from the first region; the plurality of first conductive soldering pads and the one or more of first soldering elements are electrically connected to the first wiring through connecting lines, respectively, and at least a part of the one or more of first soldering elements is electrically connected through a conductive part.

Another aspect of the present disclosure provides a module. The module includes an array substrate and a flexible circuit board. The array substrate is obtained by cutting above-mentioned substrate according; the substrate includes a first cutting line; and the first cutting line is in the second region and between the binding region and the first wiring; and in the binding region, the flexible circuit board is bound with the array substrate through a conductive adhesive.

Another aspect of the present disclosure provides a module. The module includes an array substrate and a flexible circuit board. The array substrate includes a first binding region and a second binding region on at least one side of the first binding region along a first direction; the flexible circuit board includes a third binding region and a fourth binding region on at least one side of the third binding region along the first direction; the first binding region is bound to the third binding region; and the second binding region is bound to the fourth binding region. The third binding region includes one or more of third soldering elements arranged along the first direction; the fourth binding region includes one or more of fourth soldering elements and a ground soldering element; and along the first direction, the one or more of fourth soldering elements and the ground soldering element are on a same side of the third soldering elements. At least a part of the one or more of fourth soldering elements is electrically connected to the ground soldering element.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated into a part of the specification, illustrate embodiments of the present disclosure and together with the description to explain the principles of the present disclosure.

FIG. 15 illustrates another connection schematic of first soldering elements in a substrate according to various embodiments of the present disclosure;

FIG. 16 illustrates another connection schematic of first soldering elements in a substrate according to various embodiments of the present disclosure;

FIG. 17 illustrates another connection schematic of first soldering elements in a substrate according to various embodiments of the present disclosure;

DETAILED DESCRIPTION

Figure 1:
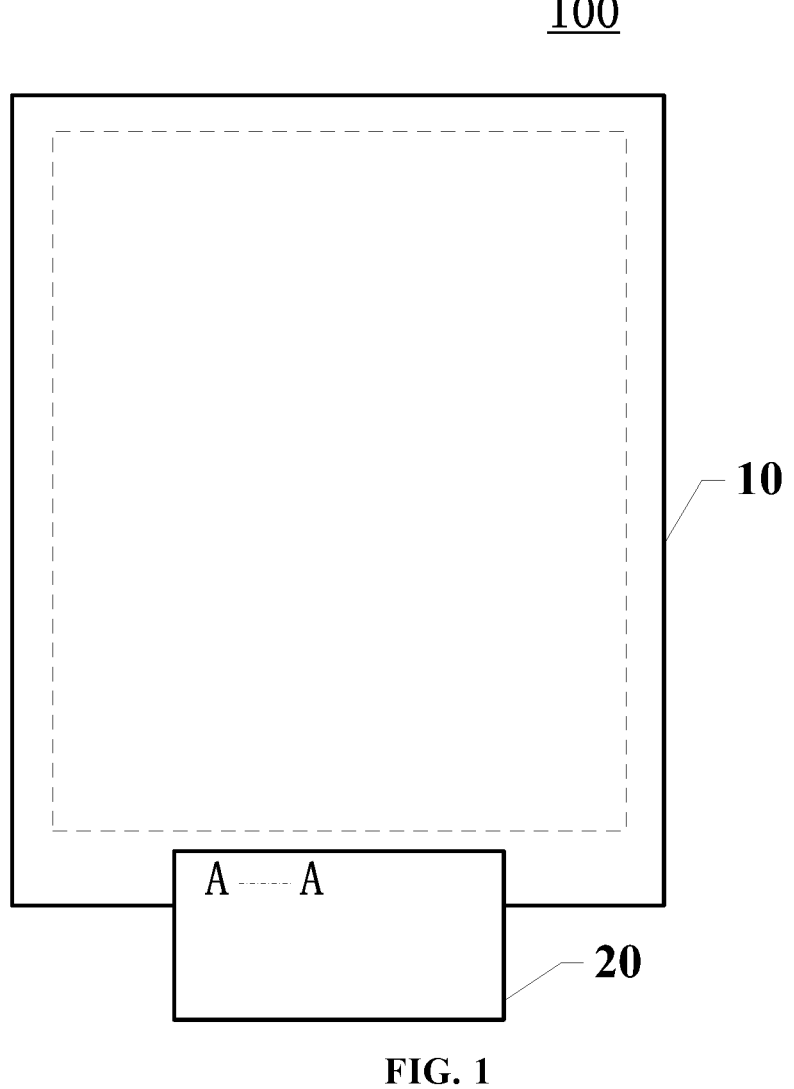
FIG. 1 illustrates a structural schematic of a module according to various embodiments of the present disclosure.

Various exemplary embodiments of the present disclosure are be described in detail with reference to the accompanying drawings. It should be noted that unless specifically stated otherwise, relative arrangement of components and steps, numerical expressions and numerical values described in these embodiments may not limit the scope of the present disclosure.

The following description of at least one exemplary embodiment may be merely illustrative and may not be used to limit the present disclosure and its application or use.

The technologies, methods, and apparatuses known to those skilled in the art may not be discussed in detail, but where appropriate, the technologies, methods, and apparatuses should be regarded as a part of the present disclosure.

In all examples shown and discussed herein, any specific value should be interpreted as merely exemplary, rather than as a limitation. Therefore, other examples in exemplary embodiment may have different values.

It is obvious to those skilled in the art that various modifications and variations can be made in the present disclosure without departing from the spirit or scope of the present disclosure. Accordingly, the present disclosure may be intended to cover modifications and variations of the present disclosure that fall within the scope of corresponding claims (claimed technical solutions) and their equivalents. It should be noted that, implementation manners provided in embodiments of the present disclosure may be combined with each other if there is no contradiction.

It should be noted that similar reference numerals and letters indicate similar items in the following drawings. Therefore, once an item is defined in one drawing, it does not need to be further discussed in the subsequent drawings.

Figure 2:
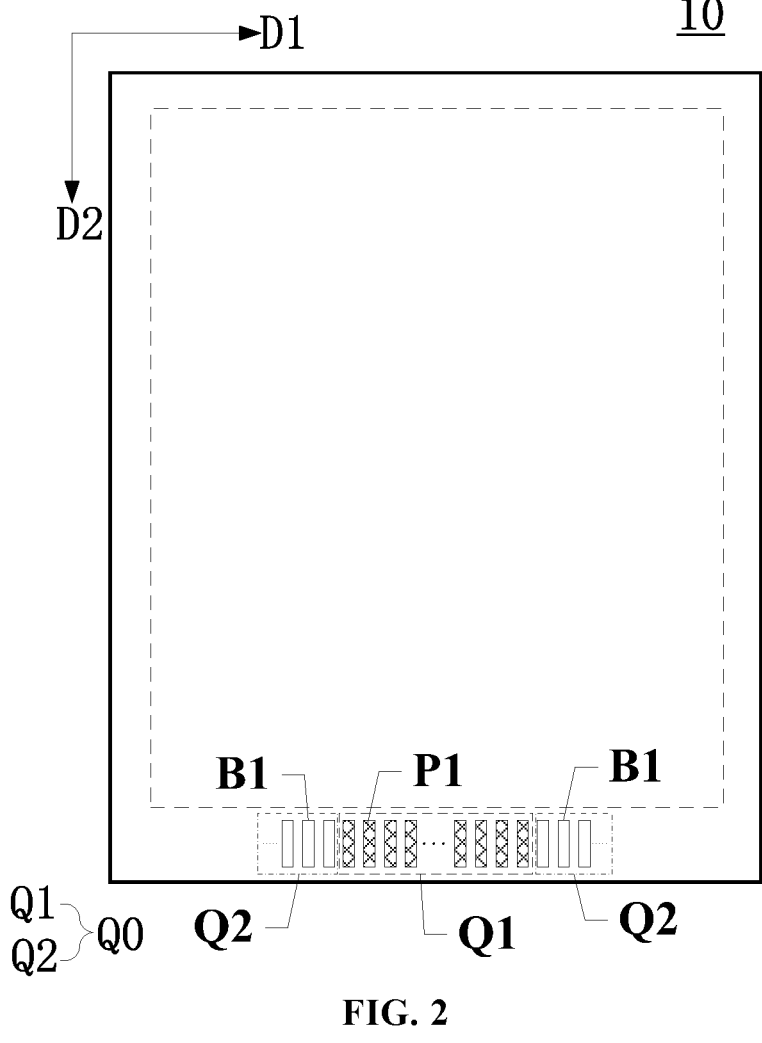
FIG. 2 illustrates a top structural view of an array substrate in a module according to various embodiments of the present disclosure.
Figure 3:
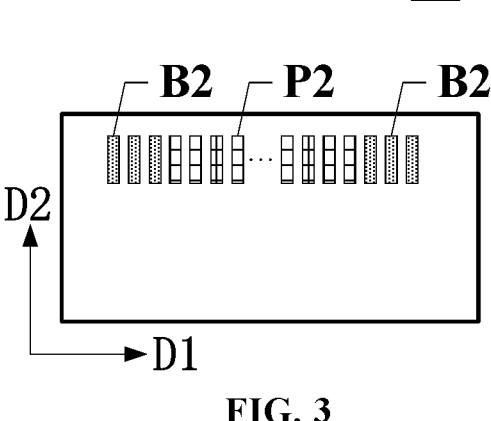
FIG. 3 illustrates a top structural view of a flexible circuit board in a module according to various embodiments of the present disclosure.
Figure 4:
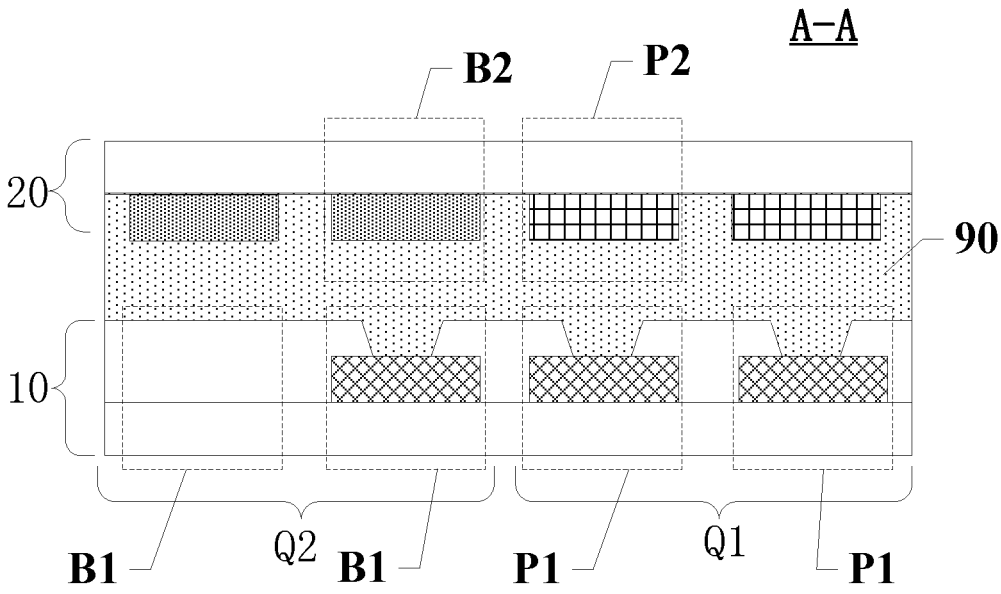
FIG. 4 illustrates a cross-sectional view of a module along an AA direction in FIG. 1.

FIG. 1 illustrates a structural schematic of a module according to various embodiments of the present disclosure; FIG. 2 illustrates a top structural view of an array substrate in a module according to various embodiments of the present disclosure; FIG. 3 illustrates a top structural view of a flexible circuit board in a module according to various embodiments of the present disclosure; and FIG. 4 illustrates a cross-sectional view of a module along an AA direction in FIG. 1.

Referring to FIGS. 1-4, embodiments of the present disclosure provide a module 100 including an array substrate 10 and a flexible circuit board 20. The array substrate 10 may include a binding region Q0; and the binding region Q0 may include a first binding region Q1 and a second binding region Q2. In the binding region Q0, the flexible circuit board 20 may be bound with the array substrate 10 through a conductive adhesive 90.

In the first binding region Q1, the array substrate 10 may include a first conductive soldering pad P1; the flexible circuit board 20 may include a second conductive soldering pad P2; and the first conductive soldering pad P1 may be electrically connected to the second conductive soldering pad P2.

In the second binding region Q2, the array substrate 10 may include a first soldering element B1; the flexible circuit board 20 may include a second soldering element B2; the first soldering element B1 and the second soldering element B2 may be fixed with each other; and at least one first soldering element of the first soldering elements B1 may be insulated from second soldering elements B2.

It can be understood that FIG. 2 only illustrates the structure of the binding region Q0 in the array substrate 10 and does not illustrate the structure of other regions on the array substrate 10. The structure of other regions may refer to the existing technology, which may not be limited in the present disclosure. In addition, the first conductive soldering pads P1 and the first soldering elements B1 of the binding region Q0 in FIG. 2 may only exemplary and may not limit actual numbers, shapes, sizes and arrangement of the first conductive soldering pads P1 and the first soldering elements B1. Similarly, FIG. 3 may only illustrate the second conductive soldering pads P2 and the second soldering elements B2 on the flexible circuit board 20 and may not limit actual numbers, shapes, sizes and arrangement of the second conductive soldering pads P2 and the second soldering elements B. FIG. 4 may only illustrate a part of the film layer structures of the array substrate 10 and the flexible circuit board, which may not represent actual numbers and sizes of film layers.

Although not shown in drawings, it should be understood that the array substrate 10 may include a plurality of signal lines, such as gate lines, data lines, clock signal lines and the like, and may further include a plurality of drive circuits, such as pixel drive circuits located in a display region, gate drive circuits located in a non-display region and the like. The signal lines and the drive circuits may eventually form electrical connection with the first conductive soldering pads P1 of the binding region Q0 to implement signal transmission. Optionally, the binding region Q0 of the array substrate 10 may be configured for binding with the flexible circuit board 20, so that the flexible circuit board 20 may be electrically connected to the signal lines, drive circuits and the like on the array substrate 10.

For example, referring to FIGS. 1-4, in the module 100 provided by embodiments of the present disclosure, the array substrate 10 may include the binding region Q0, and the binding region Q0 may include the first binding region Q1 and the second binding region Q2. A plurality of first conductive soldering pads P1 may be disposed in the first binding region Q1, and one or more of first soldering elements B1 may be disposed in the second binding region Q2. Optionally, the flexible circuit board 20 may include the second conductive soldering pads P2 corresponding to above-mentioned first conductive soldering pads P1, and further include the second soldering elements B2 corresponding to above-mentioned first soldering elements B1. Optionally, the first conductive soldering pads P1 may be soldering pads capable of transmitting signals to the signal lines or drive circuits on the array substrate 10, and the first soldering elements B1 may be dummy soldering elements and may not play a role of signal transmission.

Optionally, the flexible circuit board 20 may be bound to the array substrate 10 through the conductive adhesive 90. After the flexible circuit board 20 is bound to the binding region Q0 on the array substrate 10, the second conductive soldering pads P2 on the flexible circuit board 20 may be electrically connected and fixed with the first conductive soldering pads P1 on the array substrate 10; and the second soldering elements B2 on the flexible circuit board 20 may be fixed to the first soldering elements B1 on the array substrate 10. In embodiments of the present disclosure, in addition to the first conductive soldering pads P1 that can actually transmit signals, the binding region Q0 of the array substrate 10 may be also disposed with first soldering elements B1 that do not transmit signals. After the flexible circuit board 20 is bound to the array substrate 10, in addition to binding the first conductive soldering pads P1 to the second conductive soldering pads P2 on the flexible circuit board 20, the first soldering elements B1 may be also bound to the second soldering elements B2 on the flexible circuit board 20. In such way, the binding region between the array substrate 10 and the flexible circuit board 20 may be increased, and the binding reliability between the flexible circuit board 20 and the array substrate 10 may be improved.

When the first soldering element B1 on the array substrate 10 that does not play a role of signal transmission is bound to the second soldering element B2 on the flexible circuit board 20, if the electrical connection is formed between the first soldering element B1 and the second soldering element B2 through the conductive adhesive 90 and static electricity acts on the first soldering element B1 or the second soldering element B2, a discharge tip may be easily formed at the first soldering element B1 or the second soldering element B2. The action of static electricity tends to form cracks in the region where the first soldering element B1 or the second soldering element B2 is located. During subsequent reliability test, such as salt spray test, corrosion may form at the cracks to affect the binding effect.

In order to solve above-mentioned problems, in the module provided by the present disclosure, after the array substrate 10 is bound with the flexible circuit board 20, at least one first soldering element B1 of the first soldering elements B1 may be configured to be insulated from the second soldering elements B2 accordingly. When static electricity acts on the first soldering element B1 and the second soldering element B2 which are insulated, the discharge tip may no longer be formed. Therefore, static electricity may no longer affect the first soldering element B1 and the second soldering element B2, which may be beneficial to improve the binding reliability of the array substrate 10 and the flexible circuit board 20.

Optionally, the second binding region Q2 may be disposed with the one or more of first soldering elements B1; and the one or more of first soldering elements B1 and corresponding second soldering elements B2 may all be insulated from each other and may all not form discharge tips. Even if there is static electricity intrusion, it may not affect the first soldering elements B1 and the second soldering elements B2 and may not affect the soldering reliability between the first soldering elements B1 and the second soldering elements B2, thereby being beneficial to improve overall binding reliability between the array substrate 10 and the flexible circuit board 20.

Referring to FIGS. 1-4, in an optional embodiment of the present disclosure, at least one first soldering element B1 of the first soldering elements B1 may be free of a conductive material.

For example, in order to realize the insulation between the first soldering element B1 and the second soldering element B2, one way provided by the present disclosure may be to select the insulating material as the composition material of at least one soldering element, that is, the conductive material may not be included. In the existing technology, when the soldering element that does not play a role of signal transmission is formed in the binding region, such soldering element and the conductive soldering pad that play a role of signal transmission may be usually fabricated in a same process flow and may both include the conductive material, for example, both include a conductive metal. In the present disclosure, when forming the first soldering element B1, the conductive material originally formed at the position of the first soldering element B1 may be removed, or the conductive material may not be formed at the position corresponding to the first soldering element B1. In such way, after the flexible circuit board 20 is bound with the array substrate 10, the first soldering element B1 on the array substrate 10 may not be electrically connected with the second soldering element B2 on the flexible circuit board 20, which may avoid the formation of the discharge tip in the region where the first soldering element B1 and the second soldering element B2 are located. Therefore, it is beneficial to improve the antistatic capability of the module, and meanwhile, it is beneficial to improve the binding reliability between the flexible circuit board 20 and the array substrate 10.

Figure 5:
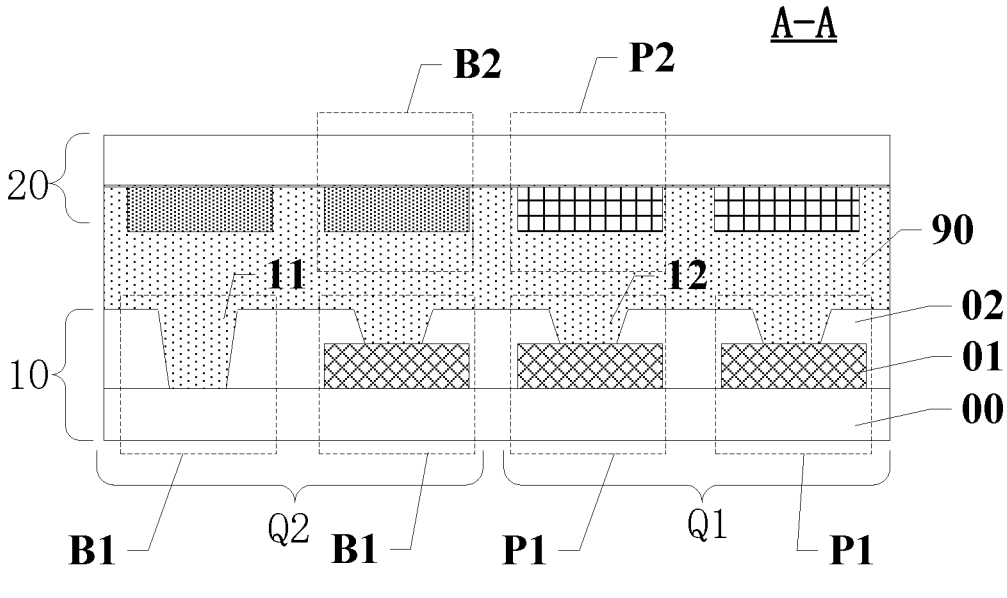
FIG. 5 illustrates another cross-sectional view of a module along an AA direction in FIG. 1.

FIG. 5 illustrates another cross-sectional view of a module along the AA direction in FIG. 1. Another structure of the first soldering element B1 on the array substrate 10 may be shown in one embodiment.

Referring to FIG. 5, in an optional embodiment of the present disclosure, at least one first soldering element B1 may include a groove 11, and at least a part of the conductive adhesive 90 may be located in the groove 11.

Optionally, the array substrate 10 may normally include a stacked structure of a plurality of film layers, and the stacked film layers may include, for example, a conductive layer and an insulating layer. When the first soldering element B1 in the array substrate 10 may only include the insulating material and may not include the conductive material, the groove 11 as shown in FIG. 5 may be formed on the first soldering element B1. When the flexible circuit board 20 is bound to the array substrate 10, the conductive adhesive 90 between the first soldering element B1 and the second soldering element B2 may be in the groove 11, which may be beneficial to increase the contact area between the conductive adhesive 90 and the first soldering element B1, thereby increasing the base area of the conductive adhesive 90 and the array substrate 10. Therefore, it is beneficial to improve the binding reliability between the first soldering element B1 and the second soldering element B2, and further to improve the binding reliability between the array substrate 10 and the flexible circuit board 20.

When the conductive adhesive 90 is used to bind the flexible circuit board 20 and the array substrate 10, the conductive adhesive 90 may have a certain fluidity before being solidified, and the overflow direction of the conductive adhesive 90 may be uncontrollable to a certain extent. If the conductive adhesive flows to the attaching region of a polarizer, the conductive adhesive may have a greater impact on the display. In the present disclosure, when the first soldering element B1 includes the groove 11, a part of the conductive adhesive 90 may flow into the groove 11. Therefore, the problem of the conductive adhesive 90 intruding into the polarizer attaching region due to the uncontrollable overflow direction of the conductive adhesive 90 may be solved to a certain extent, which may be beneficial to ensure the display effect of the display device when the module is applied to the display device.

Optionally, the conductive adhesive 90 mentioned in embodiments of the present disclosure may be, for example, ACF (anisotropic conductive film), that is, an anisotropic conductive adhesive film.

Referring to FIG. 5, in an optional embodiment of the present disclosure, in the binding region Q0, the array substrate 10 may include a substrate 00, at least one metal layer 01 and an insulating layer 02 located on the side of the metal layer 01 away from the substrate 00; and the groove 11 may be at least at the insulating layer 02.

Figure 6:
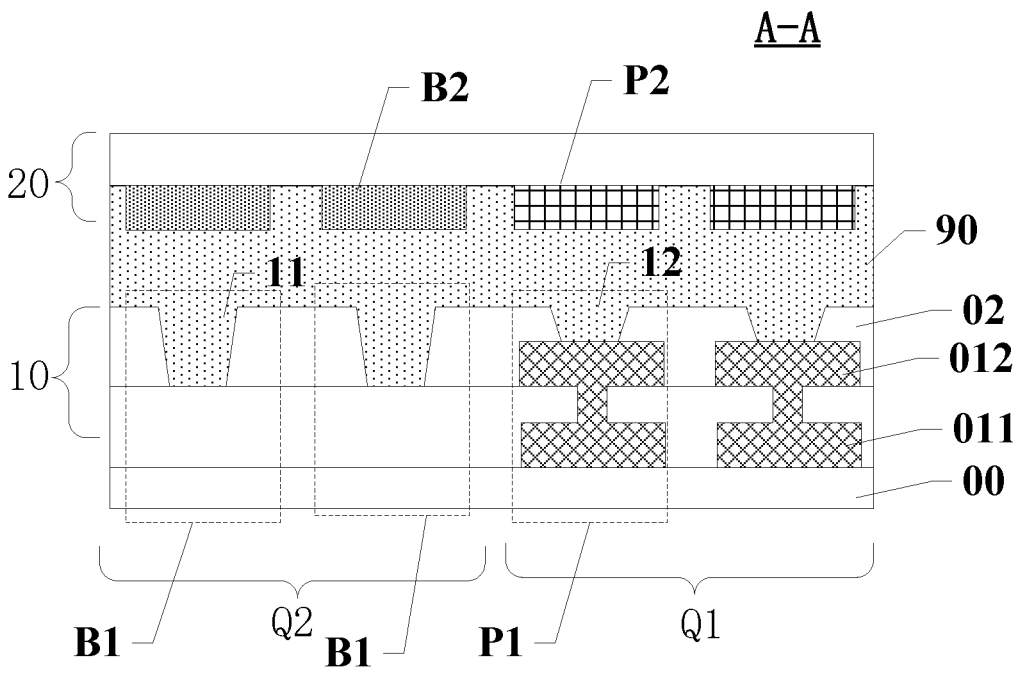
FIG. 6 illustrates another cross-sectional view of a module along an AA direction in FIG. 1.

It should be noted that FIG. 5 only shows a solution in which the array substrate 10 of the binding region Q0 includes one metal layer 01; and in some other implementations of the present disclosure, the array substrate 10 of the binding region Q0 may further include two or more metal layers. For example, referring to FIG. 6, FIG. 6 illustrates another cross-sectional view of a module along the AA direction in FIG. 1. When the binding region Q0 includes multiple metal layers, for example metal layers 011 and 012, adjacent metal layers in a direction perpendicular to the substrate may be separated by the insulating layer; and the first conductive soldering pad P1 may be formed by electrically connecting any two adjacent metal layers along the direction perpendicular to the substrate 00 through vias. Optionally, the insulating layer 02 may be disposed on the side of the uppermost metal layer (shown as the metal layer 012 in FIG. 6) in the first conductive soldering pad P1 away from the substrate 00, and the groove 11 in the first soldering element B1 may be located in the insulating layer 02. In such way, there is no need to introduce a new film layer in the array substrate 10 to form the groove 11 of the first soldering element B1, and the existing film layer structure may be reused to form the groove 11, which may be beneficial to improve the binding reliability and display stability and also be beneficial to simplify the film layer structure of the array substrate 10.

Referring to FIGS. 4-6, in an optional embodiment of the present disclosure, in the first binding region Q1, the first conductive soldering pad P1 may be located at the metal layer 011 and/or the metal layer 012, the insulating layer may include an opening 12, and the opening 12 may expose the first conductive soldering pad P1; and the opening 12 and the groove 11 may be formed in a same process.

For example, when the first conductive soldering pad P1 includes one or more metal layers, the insulating layer 02 may be introduced on the side of the uppermost metal layer (the metal layer 012 farthest from the substrate) away from the substrate 00 to isolate adjacent first conductive soldering pads P1, which may avoid short circuit between adjacent first conductive soldering pads P1. In addition, the opening 12 may be formed on above-mentioned insulating layer for exposing the first conductive soldering pad P1 in the present disclosure. When the conductive adhesive 90 is used to electrically connect the first conductive soldering pad P1 on the array substrate 10 with the second conductive soldering pad P2 on the flexible circuit board 20, at least a part of the conductive adhesive 90 may be filled into the opening 12, which may increase the contact area between the conductive adhesive 90 and the array substrate 10, and may be also beneficial to improve the binding reliability of the array substrate 10 and the flexible circuit board 20. Moreover, disposing the opening 12 may also solve the problem that the conductive adhesive 90 is intruded into the polarizer attaching region due to uncontrollable overflowing direction of the conductive adhesive 90 to a certain extent, which may be beneficial to ensure the display effect.

In embodiments of the present disclosure, the opening 12 for exposing the first conductive soldering pad P1 and the groove 11 on the first soldering element B1 may be fabricated in the same process, which may be beneficial to simplify overall fabrication process of the array substrate 10 and improve production efficiency of the array substrate 10.

Referring to FIG. 6, in an optional embodiment of the present disclosure, all first soldering elements B1 may not include the conductive material, each of the first soldering elements B1 may include the groove 11, and at least a part of the conductive adhesive 90 may be filled in the groove 11.

For example, in one embodiment, FIG. 6 shows a solution in which each first soldering element B1 on the array substrate 10 that does not perform a signal transmission function may only include the insulating material, and the groove 11 may be formed in each first soldering element B1. In such way, the discharge tip may not be formed in the region between each of the first soldering element B1 and the second soldering element B2, and even if static electricity acts on the second binding region Q2, static electricity may not affect the binding performance of the second binding region Q2, thereby being beneficial to improve overall binding reliability of the array substrate 10 and the flexible circuit board 20. In addition, the groove 11 may be formed in each first soldering element B1, so that each groove 11 may be filled with the conductive adhesive 90. On the one hand, it is more beneficial to increase the contact area between the conductive adhesive 90 and the array substrate 10, thereby improving the binding reliability between the array substrate 10 and the flexible circuit board 20; on the other hand, the design with more grooves 11 may be more beneficial to solve the problem of the conductive adhesive 90 intruding into the polarizer attaching region due to the uncontrollable overflow direction of the conductive adhesive 90, which may be beneficial to ensure the display effect.

Figure 7:
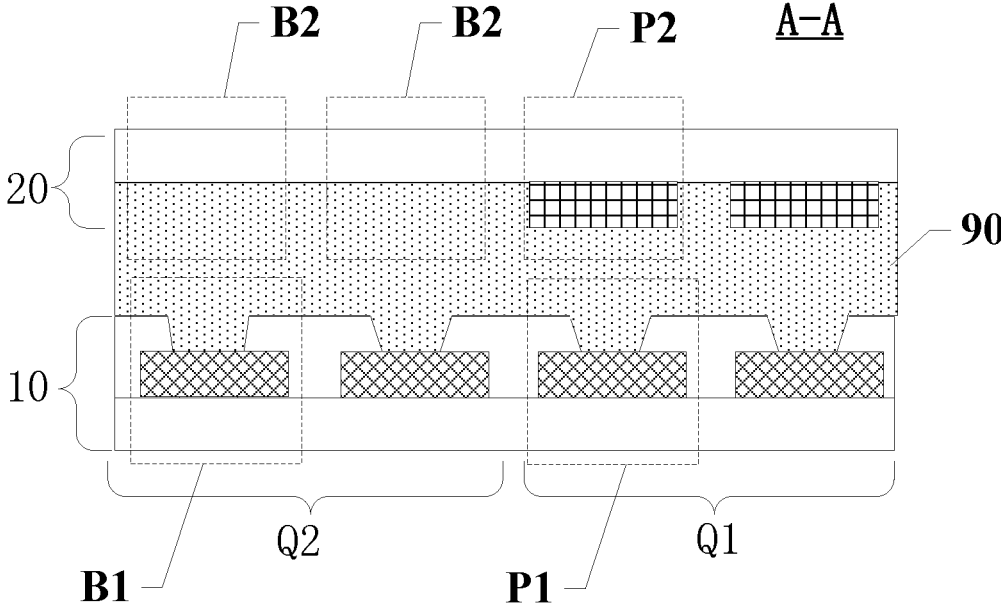
FIG. 7 illustrates another cross-sectional view of a module along an AA direction in FIG. 1.

Above-mentioned embodiments show the solution of insulating at least one first soldering element B1 from corresponding second soldering element B2 by setting that at least one first soldering element B1 may not include the conductive material. In an optional embodiment of the present disclosure, at least one second soldering element B2 may not include the conductive material. For example, referring to FIG. 7, FIG. 7 illustrates another cross-sectional view of a module along the AA direction in FIG. 1.

In the flexible circuit board of the existing technology, the second conductive soldering pad corresponding to the first conductive soldering pad on the array substrate may be normally made of a metal material, and the second soldering element may also be fabricated when the second conductive soldering pad is fabricated. That is, the second soldering element in the existing technology may include the metallic conductive material. However, at least one second soldering element B2 in the present disclosure does not include the metal conductive material, which may be beneficial to ensure the insulation reliability between the second soldering element B2 and the first soldering element B1 on the array substrate 10 and may be more beneficial to avoid occurrence of the phenomenon that the discharge tip may be formed in the regions corresponding to the first soldering element B1 and the second soldering element B2. In an actual production process, the conductive material may not be formed at the position corresponding to the second soldering element B2; or the conductive material may be formed at the position corresponding to the second soldering element B2, and the conductive material may be removed subsequently, which may not be limited in the present disclosure.

Optionally, at least one of the first soldering element B1 and second soldering element B2 which are correspondingly disposed may be configured to not include the conductive material, thereby realizing the insulating and fixing relationship between the first soldering element B1 and the second soldering element B2.

Referring to FIGS. 1-7, in above-mentioned embodiment of the module provided by the present disclosure, at least one first soldering element B1 located in the second binding region Q2 may be configured to be insulated from the second soldering element B2 corresponding to the first soldering element B1, which may be beneficial to avoid the formation of the discharge tip in the region where the first soldering element B1 and the second soldering element B2 are located, eliminate the static electricity transmission path, and avoid the influence of static electricity on the binding reliability of the first soldering element B1 and the second soldering element B2. Therefore, it may be beneficial to improve overall binding reliability of the array substrate 10 and the flexible circuit board 20 in the module.

Figure 8:
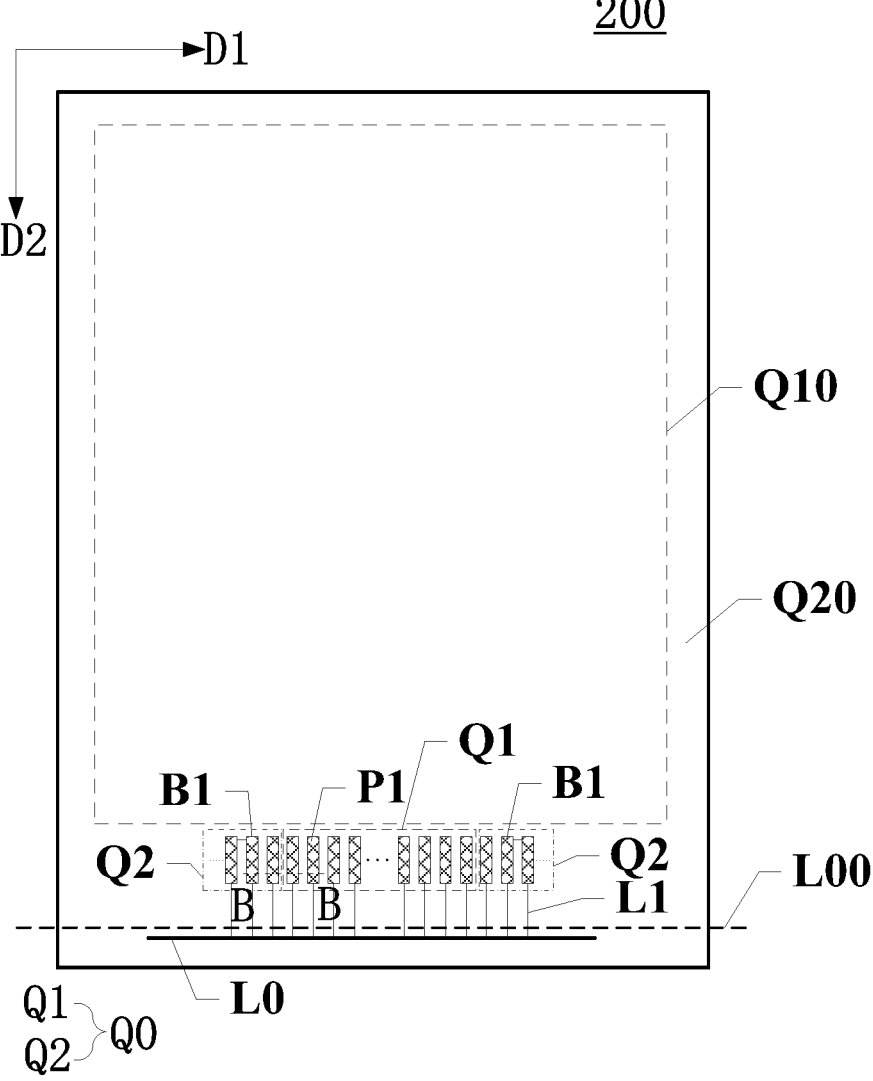
FIG. 8 illustrates a top view of a substrate according to various embodiments of the present disclosure.
Figures 9, 10:
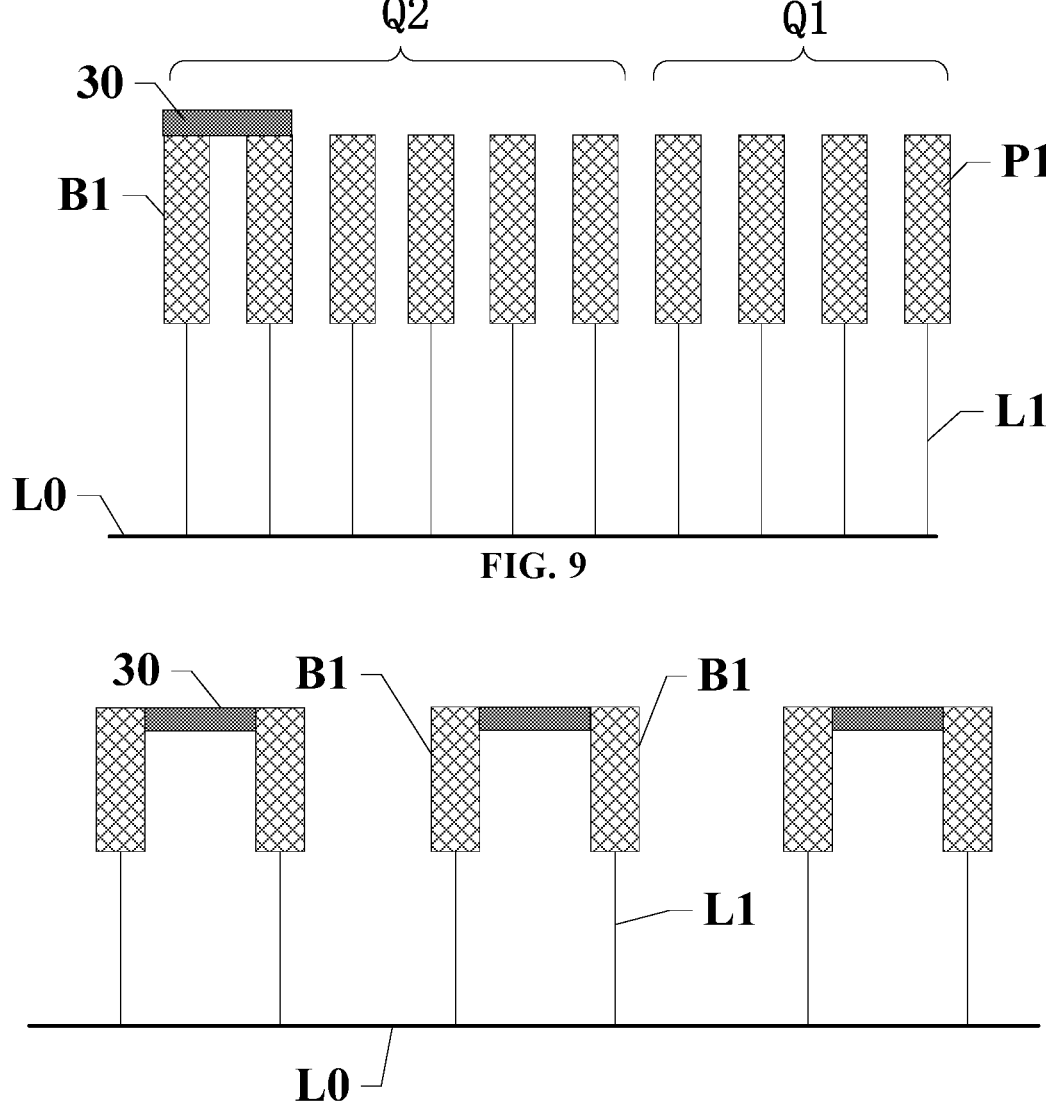
FIG. 9 illustrates a connection schematic of first conductive soldering pads, first soldering elements and a first wiring in a substrate.
FIG. 10 illustrates a connection schematic of first soldering elements in a substrate according to various embodiments of the present disclosure.

FIG. 8 illustrates a top view of a substrate according to various embodiments of the present disclosure; and FIG. 9 illustrates a connection schematic of first conductive soldering pads P1, first soldering elements B1 and a first wiring L0 in a substrate. It can be understood that the substrate provided in the embodiment of the present disclosure is an intermediate product for forming the array substrate 10. For example, the array substrate 10 may be formed by cutting a part of the region on the substrate, which is described in detail hereinafter.

Based on the same inventive concept, the present disclosure also provides a substrate 200. For example, referring to FIGS. 8-9, the substrate 200 may include the first region Q10 and the second region Q20 surrounding the first region Q10; the second region Q20 may include the binding region Q0, the binding region Q0 may include the first binding region Q1 and the second binding region Q2, and along the first direction D1, the second binding region Q2 may be located on at least one side of the first binding region Q1; the plurality of first conductive soldering pads P1 may be arranged in the first binding region Q1, and the one or more of first soldering elements B1 may be arranged in the second binding region Q2; and the first direction D1 may be the arrangement direction of the plurality of first conductive soldering pads P1.

The substrate 200 may be further provided with the first wiring L0. The first wiring L0 may be located on the side of the binding region Q0 away from the first region Q10; and the first conductive soldering pad P1 and the first soldering element B1 may be electrically connected to the first wiring L0 through the connecting lines L1 respectively.

At least a part of the first soldering element B1 may be electrically connected through a conductive part 30.

It can be understood that FIG. 8 only illustrates the relative positional relationship between the first region Q10 and the second region Q20 on the substrate and does not represent the actual size of the first region Q10 and the second region Q20. The second region Q20 may include the binding region Q0. The first conductive soldering pads P1 and the first soldering elements B1 in the binding region Q0 in FIG. 8 are only for illustration and do not limit actual numbers, shapes and sizes of the first conductive soldering pads P1 and the first soldering elements B1.

Although not shown in drawings, it can be understood that the substrate 200 may include a plurality of signal lines, such as gate lines, data lines, clock signal lines and the like, and further include a plurality of drive circuits, such as a pixel drive circuit located in the first region Q10, a gate drive circuit located in the second region Q20 and the like. The signal lines and the drive circuits may eventually form electrical connection with the first conductive soldering pads P1 of the binding region Q0 to realize signal transmission.

FIG. 9 only shows the connection relationship between a part of the first conductive soldering pads P1 and a part of the first soldering elements B1, and the first wiring L0; and the connection relationship between remaining first conductive soldering pads P1 and first soldering elements B1, and the first wiring L0 may be referred to FIG. 9, which may not be described in detail herein.

For example, referring to FIGS. 8-9, in the substrate provided by embodiments of the present disclosure, in addition to the binding region Q0 in the second region Q20, a reserved region may be also disposed on the side of the binding region Q0 away from the first region Q10; the first wiring L0 may be disposed in the reserved region; and the first conductive soldering pad P1 and the first soldering element B1 in the binding region Q0 may be electrically connected to above-mentioned first wiring L0 through connecting lines L1 respectively.

It can be understood that the process of fabricating the substrate may inevitably be affected by static electricity; and when the static electricity acts on the first conductive soldering pad P1 or the first soldering element B1 on the substrate, the tip discharge phenomenon may occur at the position corresponding to the first conductive soldering pad P1 or the first soldering element B1, which may affect subsequent binding reliability.

To solve above-mentioned problem, according to various embodiments of the present disclosure, the first wiring L0 may be introduced on the side of the binding region Q0 away from the first region Q10 to electrically connect the first conductive soldering pad P1 and the first soldering element B1 to the first wiring L0 through the connecting lines L1 respectively. In such way, when static electricity acts on the first conductive soldering pad P1 or the first soldering element B1, the static electricity may be discharged through the first wiring L0, which is equivalent to forming a static electricity transmission path, thereby being beneficial to improve the antistatic performance of the substrate during the fabricating process.

In addition, at least a part of the first soldering elements B1 may be electrically connected through the conductive part 30 in the present disclosure. The first soldering element B1 may also be electrically connected to the first wiring L0 through the connecting line L1, such that a discharge circuit may be formed between the first soldering element B1, the conductive part 30 connecting the first soldering element B1, the connecting line L1 connecting the first soldering element B1, and the first wiring L0. When static electricity invades, the static electricity can be released through such discharge circuit, which may be beneficial to avoid the influence of static electricity on the first soldering element B1. Therefore, it may be more beneficial to improve the antistatic performance of the substrate and improve the binding reliability when the binding region Q0 and the flexible circuit board 20 are bound in the later stage.

It should be noted that when the array substrate 10 is formed by using the substrate provided by the embodiment of the present disclosure, after the array substrate 10 and the flexible circuit board 20 are bound, the first soldering element B1 may not need to transmit signals. Therefore, even if a part of the first soldering elements B1 is electrically connected through the conductive part 30 in the process of fabricating the substrate, overall signal transmission on the array substrate 10 may not be affected.

FIG. 10 illustrates a connection schematic of first soldering elements in a substrate according to various embodiments of the present disclosure. In one embodiment, a connection relationship between the first soldering element B1 in the first binding region Q1 and the first wiring L0 and the conductive part 30 may be illustrated.

Referring to FIG. 10, in an optional embodiment of the present disclosure, the substrate may include the plurality of conductive parts 30; each conductive part 30 may be electrically connected to at least two first soldering elements B1 respectively; and different conductive parts 30 may be connected to different first soldering elements B1.

For example, in one embodiment, the plurality of conductive parts 30 may be introduced on the substrate, and each adjacent two first soldering elements B1 may be formed into a group. Optionally, two first soldering elements B1 in each group of soldering elements may be electrically connected through the conductive part 30. In such way, two first soldering elements B1 in each group of soldering elements may form a conductive loop with the first wiring L0 through the conductive part 30 and the connecting line L1. For each first soldering element B1 is located in corresponding conductive loop, when static electricity acts on the first binding region Q1, the conductive loop may be able to conduct and discharge the static electricity, such that each first soldering element B1 may be protected from the influence of static electricity. Therefore, the antistatic capability of each first soldering element B1 may be improved, which may be beneficial to improve overall antistatic capability of the substrate.

Figures 11, 12:
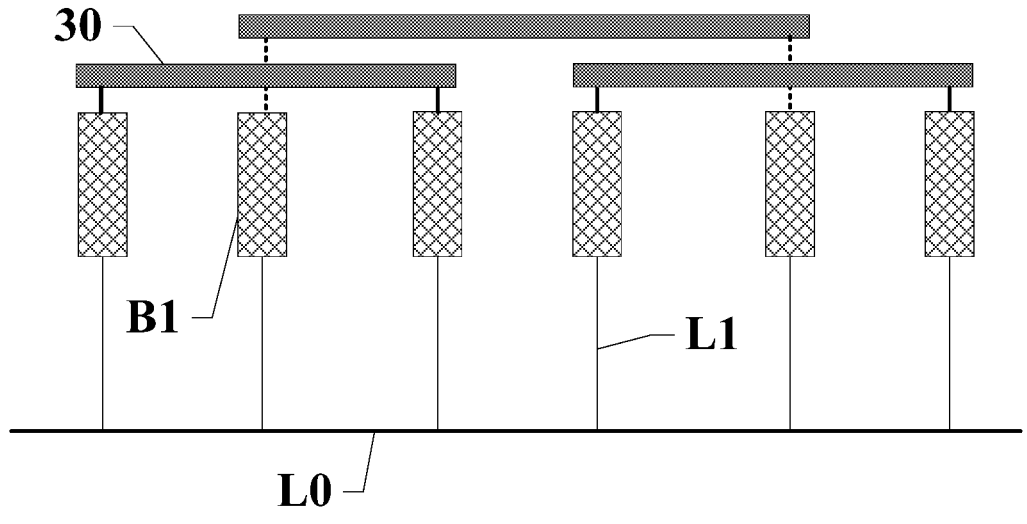
FIG. 11 illustrates another connection schematic of first soldering elements in a substrate according to various embodiments of the present disclosure.
FIG. 12 illustrates another connection schematic of first soldering elements in a substrate according to various embodiments of the present disclosure.

It can be understood that FIG. 10 only shows the solution of using the conductive part 30 to connect two adjacent first soldering elements B1. In some other embodiments of the present disclosure, the conductive part 30 may also be used to connect two non-adjacent first soldering elements B1, so that the length of the conductive part 30 may become larger, the size of formed conductive loop may become larger, and the electrostatic conduction path may be extended, which may be more beneficial to reduce the influence of static electricity. For example, referring to FIG. 11, FIG. 11 illustrates another connection schematic of first soldering elements B1 in a substrate according to various embodiments of the present disclosure. One first soldering element B1 may be also disposed between two first soldering elements B1 connected to a same conductive part 30. Obviously, FIG. 11 may only be exemplary, and may not limit the number of the first soldering elements B1 between two first soldering elements B1 connected by a same conductive part 30. In some other embodiments of the present disclosure, the number of the first soldering elements B1 between two first soldering elements B1 connected to a same conductive part 30 may also be two or more, which may not be limited according to embodiments of the present disclosure.

FIG. 12 illustrates another connection schematic of the first soldering elements B1 in a substrate according to various embodiments of the present disclosure. In one embodiment, it describes another connection relationship between the first soldering elements B1 in the first binding region Q1 and each of the first wiring L0 and the conductive part 30.

Referring to FIG. 12, in an optional embodiment of the present disclosure, the one or more of first soldering elements B1 may be electrically connected through a same conductive part 30.

For example, when only one second binding region Q2 is included in the binding region Q0, each first soldering element B1 in the second binding region Q2 may be electrically connected through a same conductive part 30, and a conductive loop may also be formed. In such way, there is no need to dispose different conductive parts 30 for the first soldering elements B1 at different positions. The conductive loop may be used to realize electrostatic conduction, and meanwhile, it is also beneficial to simplify the fabrication process of the conductive parts 30 on the substrate.

Optionally, referring to FIG. 8, when the binding region Q0 of the substrate includes two second binding regions Q2 with different positions, for example, when one second binding region Q2 is respectively disposed on both sides of the first binding region Q1, the first soldering elements B1 located in a same second binding region Q2 may be electrically connected through a same conductive part 30, and the first soldering elements B1 located in different second binding regions Q2 may correspond to different conductive parts 30. In such way, the first soldering elements B1 in different second binding regions Q2 may be respectively located in different conductive loops, which may effectively conduct static electricity.

It can be understood that above-mentioned embodiment only takes the solution in which only one row of the first soldering elements B1 is included in the second binding region Q2 as an example for description. In some other embodiments of the present disclosure, a same second binding region Q2 may further include two or more rows of first soldering elements B1. At this point, the first soldering elements B1 located in a same row may be electrically connected to a same conductive part 30, the first soldering elements B1 in different rows may correspond to different conductive parts 30, and a plurality of conductive loops may be formed in a same second binding region Q2, which may also realize effective conduction of static electricity.

Figure 13:
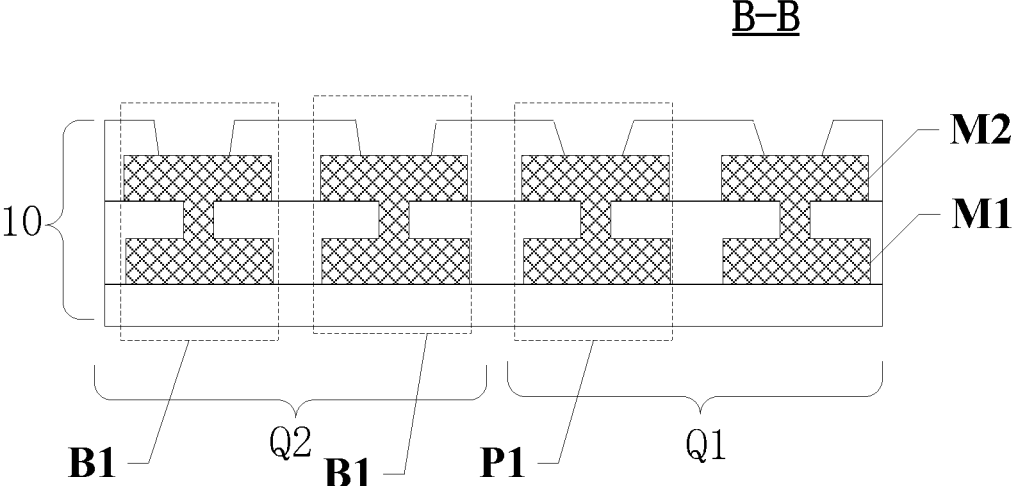
FIG. 13 illustrates a cross-sectional view of a substrate along a BB direction in FIG. 8.

FIG. 13 illustrates a cross-sectional view of a substrate along a BB direction in FIG. 8. In one embodiment, it describes a film stack structure in which a part of the first soldering elements B1 is on the substrate. Optionally, the first soldering element B1 may include different layers or two layers of conductive metals, such as the first conductive metal M1 and the second conductive metal M2. When two layers of conductive metals are included, two layers of conductive metals may be electrically connected through vias.

Referring to FIG. 13, in an optional embodiment of the present disclosure, the first soldering element B1 may include at least one layer of the conductive metal, and the conductive part 30 in above-mentioned embodiments may be disposed in a same layer as at least one layer of the conductive metal.

For example, in the present disclosure, the conductive part 30 connecting the first soldering element B1 and at least one layer of the conductive metal in the first soldering element B1 may be disposed in a same layer. The conductive part 30 may be fabricated simultaneously as the conductive metal in the first soldering element B1 is fabricated without introducing a separate fabrication process for the conductive part 30, which may be beneficial to simplify overall fabrication process of the substrate and improve production efficiency.

Optionally, when the first soldering element B1 includes two or more layers of conductive metals, the conductive part 30 may be disposed in a same layer as any layer of conductive metals in the first soldering element B1, or the conductive part 30 may also be configured to a structure of multi-layer conductive metal similar to the first soldering element B1, and multiple conductive metal layers in a same conductive part 30 may be electrically connected with each other, which may not be limited according to embodiments of the present disclosure.

Figure 14:
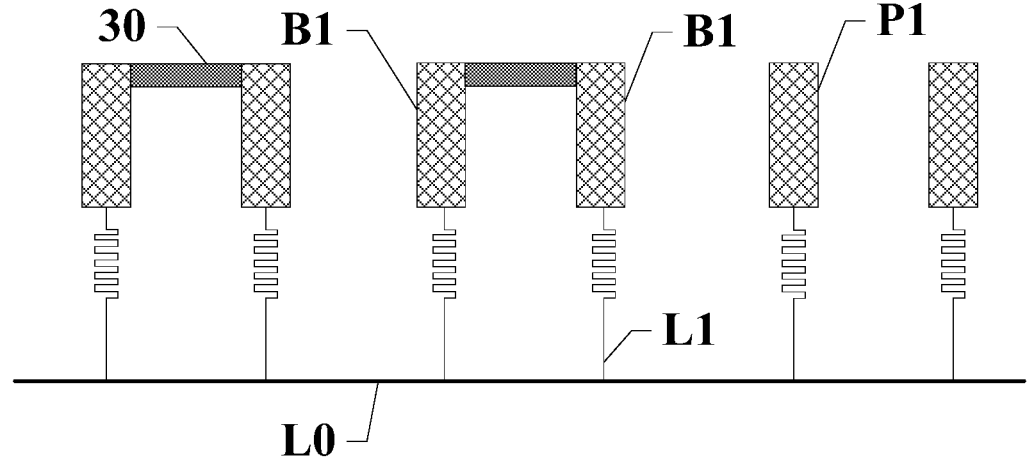
FIG. 14 illustrates another connection schematic of first soldering elements in a substrate according to various embodiments of the present disclosure.

FIG. 14 illustrates another connection schematic of first soldering elements B1 in a substrate according to various embodiments of the present disclosure. In one embodiment, the structure of the connecting line L1 between the first soldering element B1 and the first wiring L0 may be illustrated in detail.

Referring to FIG. 14, in an optional embodiment of the present disclosure, the first wiring L0 may extend along the first direction D1, the connecting line L1 may be located between the binding region Q0 and the first wiring L0, and the length of the connecting line L1 may be greater than the distance between the first wiring L0 and each of the first conductive soldering pad P1 or the first soldering element B1.

For example, in one embodiment, the extending direction of the first wiring L0 may be same as the arrangement direction of the first soldering element B1, and the connecting line L1 connecting the first wiring L0 and the first soldering element B1 may be located between the first wiring L0 and the first soldering element B1. Optionally, when the connecting line L1 is configured to connect the first soldering element B1 and the first wiring L0, the length of the connecting line L1 may be greater than the distance between the first soldering element B1 and the first wiring L0. When the connecting line L1 is used to connect the first conductive soldering pad P1 and the first wiring L0, the length of the connecting line L1 may be greater than the distance between the first conductive soldering pad P1 and the first wiring L0. Such arrangement may be equivalent to extending the charge transmission path between the first wiring L0 and the first soldering element B1 and between the first wiring L0 and the first conductive soldering pad P1. It may be equivalent to extending the charge transmission path when static electricity intrudes, which may be more beneficial for the conduction and release of static electricity, and also for preventing static electricity from being transmitted into the first region Q10 and affecting other structures on the substrate 10.

It should be noted that the distance between the first soldering element B1 and the first wiring L0 refers to the distance (the minimum distance) between the end of the first soldering element B1, which is adjacent to the first wiring L0, and the first wiring L0; and the distance between the first conductive soldering pad P1 and the first wiring L0 refers to the distance (minimum distance) between one end of the first conductive soldering pad P1, which is adjacent to the first wiring L0, and the first wiring L0.

Referring to FIG. 14, in an optional embodiment of the present disclosure, at least a part of the connecting line L1 may include a serpentine line segment.

For example, in one embodiment, a part of the connecting line L1 may be configured as a serpentine line to effectively increase the length of a single connecting line L1, thereby increasing the length of the static electricity transmission path, which may be more beneficial for the conduction and discharge of static electricity. Optionally, FIG. 14 only shows the solution of configuring the middle part of the connecting line L1 as the serpentine line. In some other embodiments of the present disclosure, in order to further increase the length of the connecting line L1, it can also be achieved by the manner of the coverage region of the serpentine line in the connecting line L1. Obviously, in some other embodiments of the present disclosure, the length of the connecting line L1 may also be increased by introducing an arc-shaped line or a folded line into the connecting line L1, which may not be limited according to various embodiments of the present disclosure.

FIG. 15 illustrates another connection schematic of the first soldering elements B1 in a substrate according to various embodiments of the present disclosure. Another illustration for the structure of the connecting line L1 between the first soldering element B1 and the first wiring L0 may be described in one embodiment.

Referring to FIG. 15, in an optional embodiment of the present disclosure, at least a part of the connecting line L1 may include the first line segment L11 and the second line segment L12 that are electrically connected with each other; the first line segment L11 may extend along the second direction D2 and be electrically connected to the first soldering element B1; and the second line segment L12 may extend along the first direction D1 and be electrically connected to the first wiring L0, where the second direction D2 may intersect the first direction D1.

For example, in one embodiment, it describes another structure of the connecting line L1 between the first wiring L0 and the first soldering element B1. Optionally, the first direction D1 refers to the extension direction of the first wiring L0 or the arrangement direction of the first soldering element B1; and the second direction D2 refers to the direction pointing from the first soldering element B1 or the first conductive soldering pad P1 to the first wiring L0. In one embodiment, at least a part of the connecting line L1 may be configured as a plurality of line segments connected end to end, for example, at least including the first line segment L11 extending along the second direction D2 and the second line segment L12 extending along the first direction D1. The second line segment L12 may be electrically connected to the first wiring L0 through a line segment extending along the second direction D2. In such way, the length of the static electricity transmission path may also be effectively extended, which may also be beneficial for the conduction and discharge of static electricity.

For two first soldering elements B1 connected by the conductive part 30, the connecting line L1 corresponding to one of the first soldering elements B1 may be configured as the structure of the plurality of above-mentioned line segments, and the connecting line L1 corresponding to the other first soldering element B1 may be configured as a single straight line (for example, the structure shown in FIG. 15), obviously, also be configured as a structure including a serpentine line (for example, refer to FIG. 16), and also be configured as the structure of the plurality above-mentioned line segments (for example, refer to FIG. 17). Therefore, the size of the conductive loop may be further increased, which may be more beneficial for the conduction and release of static electricity and avoid that static electricity affects the devices in the binding region Q0 or affects other structures on the substrate through transmitting statis electricity from the binding region Q0 to the first region Q10. FIG. 16 illustrates another connection schematic of the first soldering elements B1 in a substrate according to various embodiments of the present disclosure. FIG. 17 illustrates another connection schematic of the first soldering elements B1 in a substrate according to various embodiments of the present disclosure.

Figure 18:
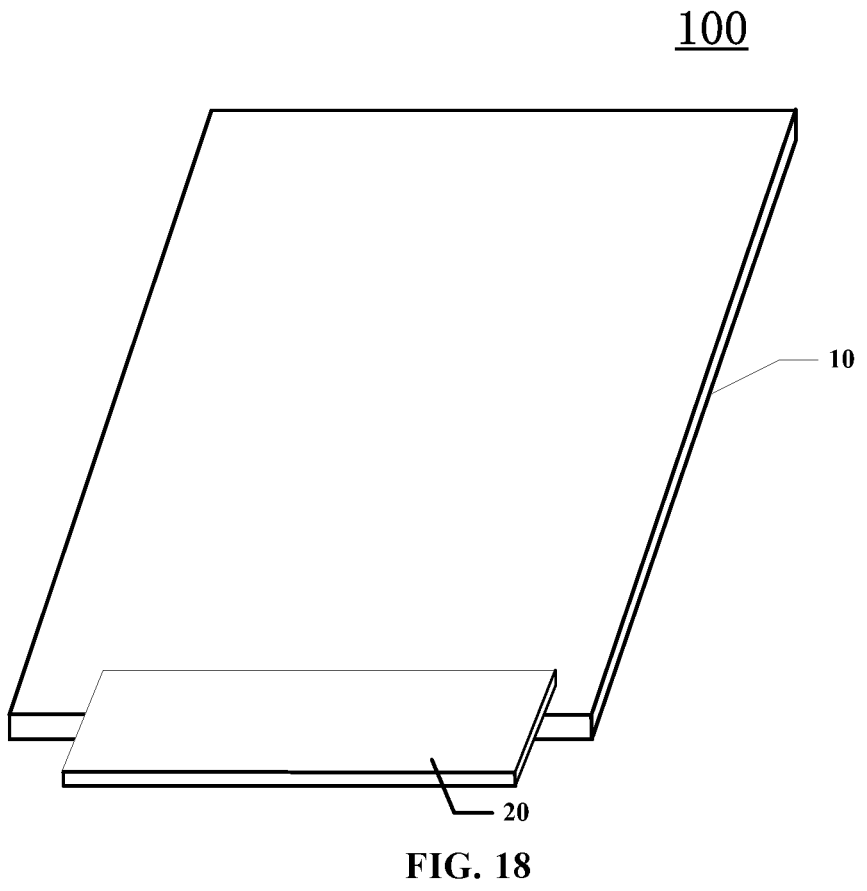
FIG. 18 illustrates another structural schematic of a module according to various embodiments of the present disclosure.

FIG. 18 illustrates another structural schematic of a module according to various embodiments of the present disclosure. Referring to FIG. 18, based on the same inventive concept, the present disclosure further provides another module 100, including the array substrate 10 and the flexible circuit board 20. The array substrate 10 may be obtained by cutting the substrate 200 in above-mentioned embodiments. As shown in FIG. 8, the substrate 200 may include the first cutting line L00, and the first cutting line L00 may be located in the second region Q20 and between the binding region Q0 and the first wiring L0; and in the binding region Q0, the flexible circuit board 20 may be bound with the array substrate 10 by the conductive adhesive.

For example, the array substrate 10 in the module of one embodiment may be obtained by cutting the substrate 200 in above-mentioned embodiments, the first cutting line L00 on the substrate may be located between the binding region Q0 and the first wiring L0, and the first wiring L0 may be separated from the substrate after cutting is performed. The flexible circuit board 20 may be bound with the array substrate 10 through the conductive adhesive to form the module in one embodiment.

Optionally, in the module 100 provided in one embodiment, the structure of the flexible circuit board 20 may refer to the structure of the flexible circuit board 20 in the embodiments of FIG. 3 and FIG. 7; and the second soldering element B2 on the flexible circuit board 20 may be insulated from the first soldering element B1 on the array substrate 10. Optionally, at least one second soldering element B2 in the flexible circuit board 20 may be configured to not include the conductive material. In such way, when the flexible circuit board 20 is bound to the array substrate 10, the second soldering element B2 on the flexible circuit board 20 may not form the discharge tip with corresponding first soldering element B1, which may prevent static electricity from causing damage to the regions where the first soldering element B1 and the second soldering element B2 are located and from affecting subsequent binding reliability. Therefore, it may also be beneficial to improve the antistatic capability of the module and the binding reliability between the array substrate 10 and the flexible circuit board 20.

Figure 19:
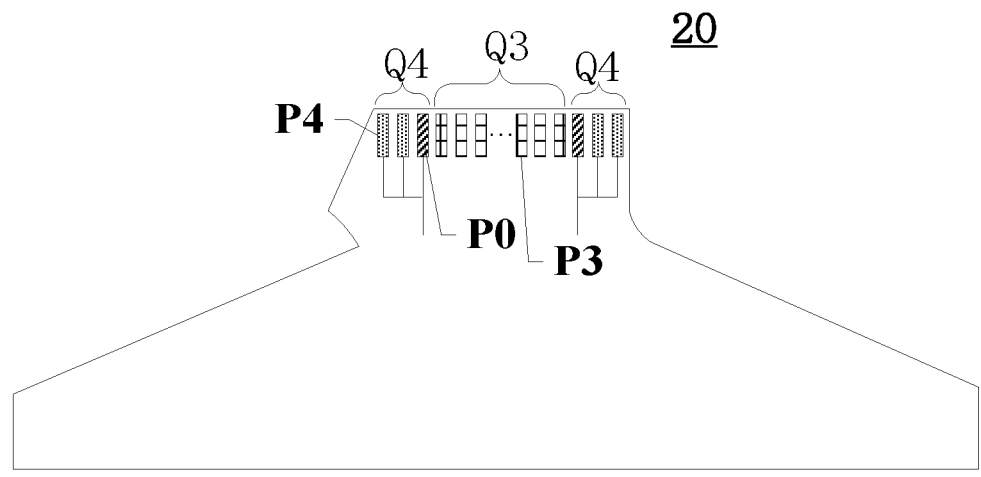
FIG. 19 illustrates a structural schematic of a flexible circuit board in a module according to various embodiments of the present disclosure.

FIG. 19 illustrates a structural schematic of the flexible circuit board 20 in the module according to various embodiments of the present disclosure. Based on the same inventive concept, the present disclosure also provides another module, and the relative positional relationship between the array substrate 10 and the flexible circuit board 20 may refer to, for example, FIG. 1 or FIG. 18. The module may include the array substrate 10 and, for example, the flexible circuit board 20 shown in FIG. 19. The structure of the array substrate may refer to the structures in embodiments of FIGS. 2-7 or may use the structure of the array substrate 10 in corresponding embodiments of FIG. 18. The array substrate 10 may include the first binding region Q1 and the second binding region Q2 located on at least one side of the first binding region Q1 along the first direction D1. The flexible circuit board 20 may include the third binding region Q3 and the fourth binding region Q4 located on at least one side of the third binding region Q3 along the first direction D1; the first binding region Q1 may be bound to the third binding region Q3; and the second binding region Q2 may be bound to the fourth binding region Q4. The third binding region Q3 may include third soldering elements P3 arranged along the first direction D1; the fourth binding region Q4 may include fourth soldering elements P4 and a ground soldering element P0; along the first direction D1, the fourth soldering elements P4 and the ground soldering element P0 may be located on a same side of the third soldering element P3; and at least one fourth soldering element P4 may be electrically connected to the ground soldering element P0.

Optionally, in the module provided in one embodiment, the structure of the array substrate 10 may use the structure corresponding to FIGS. 4-7, that is, at least one first soldering element B1 in the array substrate 10 may not contain the conductive material. Therefore, when the first soldering element B1 and the fourth soldering element P4 on the flexible circuit board 20 are bound, the first soldering element B1 and the fourth soldering element P4 may be insulated, and the discharge tip may not be formed, which may avoid electrostatic damage to the region where the first soldering element B1 and the fourth soldering element P4 are located, thereby improving binding reliability.

Optionally, in the module provided in one embodiment, the structure of the array substrate 10 may also use the structure corresponding to the embodiment shown in 18 and may be formed by cutting the substrate shown in FIG. 8.

In one embodiment, the relative positional relationship between the third soldering elements P3, the fourth soldering elements P4 and the ground soldering element P0 on the flexible circuit board 20 may be only illustrated in FIG. 19, which may not represent actual shapes, numbers and sizes. Optionally, the third soldering element P3 on the flexible circuit board 20 may be configured for binding with the first conductive soldering pad P1 on the array substrate 10 to transmit signals, and the fourth soldering element P4 on the flexible circuit board 20 may be configured for binding with the first soldering element B1 on the array substrate 10, which may increase the binding region between the flexible circuit board 20 and the array substrate 10, thereby improving binding reliability.

In one embodiment, the ground soldering element P0 may be disposed on the flexible circuit board 20, and at least one fourth soldering element P4 may be electrically connected to the ground soldering element P0. After the flexible circuit board 20 is bound with the array substrate 10, even if static electricity invades into the region where the fourth soldering element P4 and the first soldering element B1 are located, the static electricity may also be conducted to the ground soldering element P0 through the fourth soldering element P4, which may avoid static electricity from causing damage to the positions of the first soldering element B1 and the fourth soldering element P4 and may also be beneficial to improve the antistatic capability of the module and the binding reliability between the flexible circuit board 20 and the array substrate 10.

The flexible circuit board 20 is disposed with the ground soldering element P0 for conducting static electricity. Therefore, regardless of whether the array substrate 10 uses the structure shown in FIGS. 4-7 or the structure corresponding to the embodiment of FIG. 18, static electricity may be conducted to the outside of the module through the ground soldering element P0, thereby being beneficial to improve the antistatic ability and binding reliability of the module.

Figure 20:
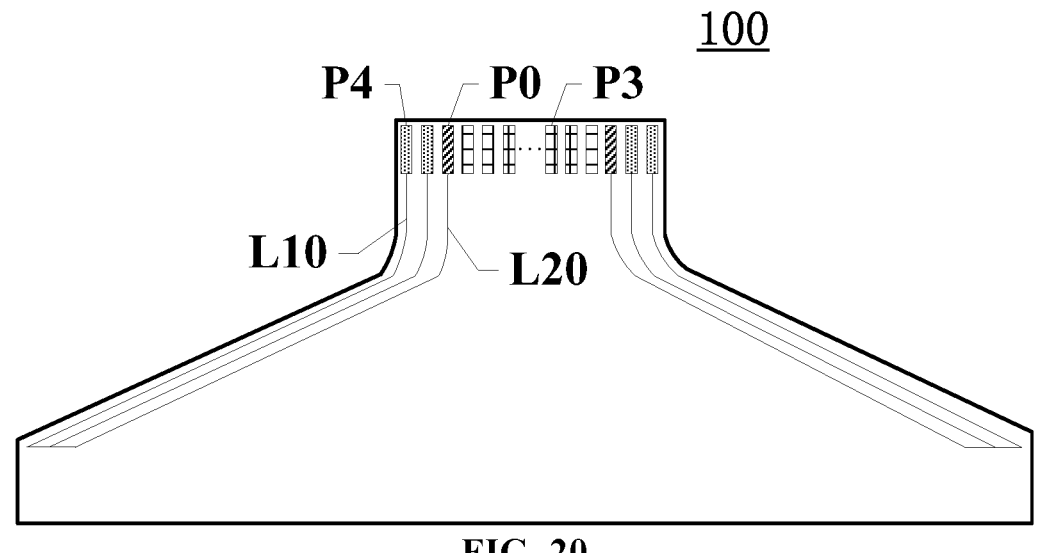
FIG. 20 illustrates a connection schematic of a fourth soldering element and a ground soldering element on a flexible circuit board according to various embodiments of the present disclosure.

FIG. 20 illustrates a connection schematic of the fourth soldering elements P4 and the ground soldering element P0 on the flexible circuit board 20 according to various embodiments of the present disclosure. In one embodiment, the flexible circuit board 20 with a special-shaped structure may be used as an example for description, and actual outline structure of the flexible circuit board 20 may not be illustrated. In some other embodiments of the present disclosure, the outline shape of the flexible circuit board 20 may also be embodied in other shapes, which may not be described in embodiments of the present disclosure.

Referring to FIG. 20, in an optional embodiment of the present disclosure, the flexible circuit board 20 may further include a first led-out line L10 and a second led-out line L20. The first end of the first led-out line L10 may be electrically connected to the fourth soldering element P4, and the first end of the second led-out line L20 may be electrically connected to the ground soldering element P0. The first led-out line L10 and the second led-out line L20 may be wired along at least a part of the outer edge of the flexible circuit board 20; and the second end of the first led-out line L10 and the second end of the second led-out line L20 may be electrically connected with each other.

For example, the first led-out line L10 in one embodiment may be regarded as a wiring drawn from the fourth soldering element P4 of the flexible circuit board 20 and electrically connected to the fourth soldering element P4; and the second led-out line L20 may be regarded as a wiring drawn from the ground soldering element P0 of the flexible circuit board 20 and electrically connected to the ground soldering element P0. Ends of the first led-out line L10 and the second led-out line L20 far away from the fourth soldering element P4 and the ground soldering element P0 may be electrically connected with each other. In the present disclosure, both the first led-out line L10 and the second led-out line L20 may be wired along at least a part of the outer edge of the flexible circuit board 20, which may be equivalent to extending the length of the connecting line L1 between the fourth soldering element P4 and the ground soldering element P0. When static electricity acts on the fourth soldering element P4 and the first soldering element B1 corresponding to the fourth soldering element P4, the static electricity may be conducted to the ground soldering element P0 through the first led-out line L10 and the second led-out line L20. The longer the length of the first led-out line L10 and the second led-out line L20, the more beneficial for the static electricity discharge, the more beneficial for avoiding the influence of static electricity on the first soldering element B1 and the second soldering element B2, such as damage and the like;

and therefore, the more beneficial for improving the binding reliability of the first soldering element B1 and the fourth soldering element P4.

Referring to FIG. 20, in an optional embodiment of the present disclosure, the one or more of fourth soldering elements P4 may be electrically connected to the second led-out line L20 through different first led-out lines L10.

For example, when the one or more of fourth soldering elements P4 are disposed in the same fourth binding region Q4 on the flexible circuit board 20, different first led-out lines L10 can be drawn out from the one or more of fourth soldering elements P4, respectively. Different first led-out lines L10 may be wired according to the outline shape of the outer frame of the flexible circuit board 20, and different first led-out lines L10 may all be electrically connected to the second led-out line L20 drawn from the ground soldering element P0. Therefore, the static electricity acting on each fourth soldering element P4 or the first soldering element B1 may be conducted to the ground soldering element P0 through the first led-out line L10 and the second led-out line L20. Moreover, the lengths of the first led-out line L10 and the second led-out line L20 may be greatly increased by wiring along the outer frame of the flexible circuit board 20, and the path of static electricity conduction may be increased. Therefore, the influence of static electricity on the first soldering element B1 and the fourth soldering element P4 may be largely avoided, which may be more beneficial to improve the binding reliability of the flexible circuit board 20 and the array substrate 10.

From the above-mentioned embodiments, it may be seen that the module and the substrate provided by the present disclosure may achieve at least following beneficial effects.

In the module provided by embodiments of the present disclosure, the soldering element of the array substrate and the flexible circuit board that does not play a role in signal transmission may be insulated, which may be beneficial to increase the binding region between the array substrate and the flexible circuit board and improve the binding reliability and may also avoid discharge tip generation, improve overall antistatic performance of the module, and ensure the binding reliability between the array substrate and the flexible circuit board. Or, according to the present disclosure, the ground soldering element on the flexible circuit board may be disposed, and the soldering element that does not play a role in signal transmission may be electrically connected with the ground soldering element to form the electrostatic discharge path. When the static electricity acts the soldering element that does not play a role of signal transmission, the static electricity may be conducted to the grounded soldering element and released. In such way, the influence of static electricity on the soldering elements on the flexible circuit board and the array substrate may be avoided, which may also be beneficial to improve overall antistatic performance of the module and the binding reliability of the array substrate and the flexible circuit board. In the substrate provided by embodiments of the present disclosure, the first wiring may be introduced on the substrate, both the first soldering element and the first conductive soldering pad on the substrate may be electrically connected to the first wiring through different connecting lines, and a part of the first soldering elements may be connected through the conductive parts, which may also form the electrostatic transmission path to conduct and release static electricity, thereby being beneficial to improve the antistatic ability of the substrate in the fabrication process.

Although some embodiments of the present disclosure have been described in detail through examples, those skilled in the art should understand that above-mentioned examples are provided for illustration only and not for the purpose of limiting the scope of the disclosure. Those skilled in the art should understand that modifications may be made to above-mentioned embodiments without departing from the scope and spirit of the present disclosure. The scope of the present disclosure may be defined by appended claims.

What is claimed is:

1. A module, comprising:

an array substrate and a flexible circuit board, wherein:

the array substrate includes a binding region; and the binding region includes a first binding region and a second binding region; and in the binding region, the flexible circuit board is bound with the array substrate through a conductive adhesive;

in the first binding region, the array substrate includes a first conductive soldering pad; the flexible circuit board includes a second conductive soldering pad; and the first conductive soldering pad is electrically connected to the second conductive soldering pad, wherein an opening is provided above the first conductive soldering pad to expose the first conductive soldering pad, at least a part of the conductive adhesive is filled into the opening such that the first conductive soldering pad directly binds to the at least a part of the conductive adhesive; and in the second binding region, the array substrate includes one or more first soldering elements; the flexible circuit board includes one or more second soldering elements; a first soldering element of the one or more of first soldering elements is fixed with a second soldering element of the one or more of second soldering elements; and at least one first soldering element of the one or more of first soldering elements is insulated from the one or more of second soldering elements, wherein at least one first soldering element of the one or more of first soldering elements includes a groove, and at least a part of the conductive adhesive is in the groove.

2. The module according to claim 1, wherein:

at least one first soldering element of the one or more of first soldering elements is free of a conductive material.

3. The module according to claim 1, wherein:

in the binding region, the array substrate includes a substrate, at least a metal layer, and an insulating layer on a side of the metal layer away from the substrate; and the groove is at least at the insulating layer.

4. The module according to claim 3, wherein:

in the first binding region, the first conductive soldering pad is at the metal layer, the insulating layer includes the opening; and the opening and the groove are formed using a same process.

5. The module according to claim 1, wherein:

each first soldering element is free of a conductive material, each first soldering element includes a groove, and at least a part of the conductive adhesive is filled in the groove.

6. The module according to claim 1, wherein:

at least one second soldering element of the one or more of second soldering elements is free of a conductive material.

7. The module according to claim 1, wherein:

the array substrate includes a substrate; the substrate includes a plurality of conductive parts; each conductive part is electrically connected to at least two first soldering elements, respectively; and different conductive parts are connected to different first soldering elements.

8. The module according to claim 1, wherein:

the one or more of first soldering elements are electrically connected through a same conductive part.

9. The module according to claim 1, wherein:

a first soldering element of the one or more of first soldering elements includes at least one layer of a conductive metal, and a conductive part is disposed in a same layer as the at least one layer of the conductive metal.

10. The module according to claim 9, wherein:

the substrate further include a disposed first wiring; the first wiring extends along a first direction; a connecting line is between the binding region and the first wiring; and a length of the connecting line is greater than a distance between the first conductive soldering pad and the first wiring or a distance between a first soldering element of the one or more of first soldering elements and the first wiring.

11. The module according to claim 10, wherein:

at least a part of the connecting line includes a serpentine line segment.

12. The module according to claim 10, wherein:

at least a part of the connecting line includes a first line segment and a second line segment that are electrically connected with each other; the first line segment extends along a second direction and is electrically connected to the first soldering element; and the second line segment extends along the first direction and is electrically connected to the first wiring, wherein the second direction intersects the first direction.

13. The module according to claim 7, wherein:

the array substrate is obtained by cutting the substrate; the substrate includes a first cutting line; and the first cutting line is between the binding region and the first wiring; and in the binding region, the flexible circuit board is bound with the array substrate through a conductive adhesive.

14. The module according to claim 1, wherein:

the flexible circuit board further includes a first led-out line and a second led-out line, wherein a first end of the first led-out line is electrically connected to a fourth soldering element, and a first end of the second led-out line is electrically connected to a ground soldering element; and the first led-out line and the second led-out line are wired along at least a part of an outer edge of the flexible circuit board; and a second end of the first led-out line is electrically connected to a second end of the second led-out line.

15. The module according to claim 14, wherein:

one or more of fourth soldering elements are electrically connected to the second led-out line through different first led-out lines.

* * * * *